United States Patent
Vornbrock et al.

(10) Patent No.: US 9,573,214 B2
(45) Date of Patent: Feb. 21, 2017

(54) SOLDER APPLICATION METHOD AND APPARATUS

(71) Applicant: Merlin Solar Technologies, Inc., San Jose, CA (US)

(72) Inventors: Alejandro de la Fuente Vornbrock, San Carlos, CA (US); Venkateswaran Subbaraman, San Jose, CA (US)

(73) Assignee: Merlin Solar Technologies, Inc., San Jose, CA (US)

( * ) Notice: Subject to any disclaimer, the term of this patent is extended or adjusted under 35 U.S.C. 154(b) by 266 days.

(21) Appl. No.: 14/454,720

(22) Filed: Aug. 8, 2014

(65) Prior Publication Data

US 2016/0039032 A1    Feb. 11, 2016

(51) Int. Cl.
| | |
|---|---|
| *B23K 1/08* | (2006.01) |
| *B23K 3/06* | (2006.01) |
| *B23K 1/00* | (2006.01) |
| *H01L 31/0224* | (2006.01) |

(52) U.S. Cl.
CPC .............. *B23K 1/08* (2013.01); *B23K 1/0016* (2013.01); *B23K 3/0676* (2013.01); *H01L 31/022425* (2013.01); *Y02P 70/521* (2015.11)

(58) Field of Classification Search
CPC ....... B23K 1/0016; B23K 1/08; B23K 3/0676; H01L 31/022425
See application file for complete search history.

(56) References Cited

U.S. PATENT DOCUMENTS

| | | | | | |
|---|---|---|---|---|---|
| 1,482,012 | A | * | 1/1924 | Howard | D21F 1/32 162/199 |
| 2,937,108 | A | * | 5/1960 | Toye | C23C 2/08 118/101 |
| 3,016,041 | A | * | 1/1962 | Oganowski | C23C 2/22 118/115 |
| 3,653,948 | A | * | 4/1972 | Kaempgen | D04H 1/645 118/120 |
| 3,932,683 | A | * | 1/1976 | Robins | C23C 2/20 118/63 |
| 4,262,625 | A | | 4/1981 | Carravetta et al. | |
| 4,437,236 | A | | 3/1984 | Oswald, Jr. | |
| 4,465,014 | A | * | 8/1984 | Bajka | B23K 3/0653 118/114 |

(Continued)

FOREIGN PATENT DOCUMENTS

JP         58192673 A  * 11/1983

*Primary Examiner* — Devang R Patel
*Assistant Examiner* — Carlos Gamino
(74) *Attorney, Agent, or Firm* — The Mueller Law Office, P.C.

(57) ABSTRACT

A method of applying solder includes providing a first roller and a second roller, where at least one of the first and second rollers has an outer surface comprising a solder wicking material. A metallic article is provided, the metallic article having a first side and a second side, and having an opening extending from the first side to the second side. The metallic article is dipped in solder, where the dipping forms an initial coating of solder on the metallic article. After the dipping, the metallic article is fed between the first and second rollers. The wicking material removes solder from the metallic article, such that a solder thickness of the initial coating on the metallic article is reduced after exiting the first and second rollers.

19 Claims, 5 Drawing Sheets

(56) References Cited

U.S. PATENT DOCUMENTS

| | | | |
|---|---|---|---|
| 4,563,974 A * | 1/1986 | Price | B23K 1/085 |
| | | | 118/206 |
| 4,586,934 A * | 5/1986 | Blalock | D06B 11/0093 |
| | | | 427/359 |
| 4,598,012 A * | 7/1986 | Miller | B29C 70/20 |
| | | | 427/246 |
| 4,608,941 A * | 9/1986 | Morris | B23K 1/085 |
| | | | 118/404 |
| 4,836,131 A | 6/1989 | Kataoka | |
| 4,858,554 A | 8/1989 | Tsuchiya | |
| 4,898,117 A | 2/1990 | Ledermann et al. | |
| 5,007,369 A * | 4/1991 | Morris | B23K 1/085 |
| | | | 118/410 |
| 5,057,337 A | 10/1991 | Makino et al. | |
| 5,139,822 A | 8/1992 | Hepler et al. | |
| 5,184,767 A | 2/1993 | Estes | |
| 5,222,650 A | 6/1993 | Lymn | |
| 5,240,738 A * | 8/1993 | Quirk | C23C 2/20 |
| | | | 427/348 |
| 5,298,303 A * | 3/1994 | Kerr | C08G 18/12 |
| | | | 206/524.2 |
| 5,301,862 A | 4/1994 | Shigematsu et al. | |
| 5,348,611 A | 9/1994 | Lavrenge et al. | |
| 5,670,237 A * | 9/1997 | Shultz | B29C 43/222 |
| | | | 427/198 |
| 5,711,806 A * | 1/1998 | Harnden | H05K 3/0088 |
| | | | 118/407 |
| 6,042,648 A * | 3/2000 | Corey | B23K 3/0669 |
| | | | 118/423 |
| 6,871,776 B2 | 3/2005 | Trucco | |
| 7,982,320 B2 * | 7/2011 | Lee | B23K 3/0623 |
| | | | 228/111.5 |
| 2001/0052536 A1 | 12/2001 | Scherdorf et al. | |
| 2004/0108365 A1 * | 6/2004 | Tapper | B23K 1/0012 |
| | | | 228/183 |
| 2004/0115536 A1 * | 6/2004 | Blankenborg | C25D 1/04 |
| | | | 429/245 |
| 2011/0174354 A1 * | 7/2011 | Kutzer | H01L 31/188 |
| | | | 136/244 |
| 2013/0213451 A1 * | 8/2013 | Nakauchi | H01L 31/022425 |
| | | | 136/244 |
| 2014/0261654 A1 * | 9/2014 | Babayan | C25D 1/10 |
| | | | 136/256 |
| 2015/0129024 A1 * | 5/2015 | Brainard | H01L 31/022425 |
| | | | 136/256 |
| 2015/0171239 A1 * | 6/2015 | Tanaka | H01L 31/022425 |
| | | | 136/256 |

* cited by examiner

SOLDER APPLICATION METHOD AND APPARATUS

BACKGROUND OF THE INVENTION

Preparing metallic components for solder joining requires significant preparation of the surfaces such that the solder wets these components cleanly and ensures a high strength bond. These components may be treated with an agent such as a flux that will clean the component, remove any tarnish, protect the component from further tarnishing, and promote the wetting of the solder onto the component. Additionally, a component may be pre-coated with the correct amount of solder required to complete the soldering process, thus potentially facilitating the joining process.

The most common coatings used to ensure solderability include a solder, silver, gold or a combination of metals such as nickel and gold. The choice of coatings and coating process depends on the environmental conditions the component must survive, the complexity of the component, and budget. For many components a coating of solder is effective and can be applied from molten solder via a variety of processes such as dipping the component in a bath of solder, solder fountain, solder wave, or by being sprayed by molten solder. If the amount of solder must be controlled, processes such as hot air solder leveling, roller tinning and solder dispensing can be used to transfer molten solder. If even more control is required and a higher cost process is acceptable, solder can be applied by electroplating which can achieve a uniform coating with finely controlled thickness. Yet, there remains a need for further control of solder application, for various types components where cost is critical and/or where features present difficulties in attaining the desired solder specifications.

SUMMARY OF THE INVENTION

A method of applying solder includes providing a first roller and a second roller, where at least one of the first and second rollers has an outer surface comprising a solder wicking material. A metallic article has a first side and a second side, and comprises an opening extending from the first side to the second side. In some embodiments, the metallic article is an electrical conduit for a surface of a photovoltaic cell, such as a metallic article comprising a plurality of intersecting grid lines, and is a free-standing piece to be coupled to the photovoltaic cell. The metallic article is dipped in solder, where the dipping forms an initial coating of solder on the metallic article. After the dipping, the metallic article is fed between the first and second rollers. The wicking material removes solder from the metallic article, such that a solder thickness of the initial coating on the metallic article is reduced after exiting the first and second rollers.

BRIEF DESCRIPTION OF THE DRAWINGS

Each of the aspects and embodiments of the invention described herein can be used alone or in combination with one another. The aspects and embodiments will now be described with reference to the attached drawings.

DETAILED DESCRIPTION OF THE EMBODIMENTS

Processes such as hot air solder leveling and electroplating are known methods for applying solder to components. However, for components that are small and/or very flexible, most processes for transferring molten solder will not be able to control the amount of solder accurately enough or will damage the small or flexible features. Additionally, processes such as electroplating can be cost-prohibitive for such components.

In the present disclosure, solder application using a dipping and blotting process of molten solder can address the drawbacks of poor solder volume control and of the large mechanical forces involved in most molten solder transfer processes. The present processes combine the reliable solder coating of a solder dipping process with the solder volume control of a hot air solder leveling process or roller tinning process. The present methods enable removal of solder to achieve a desired coating thickness, without the high forces of hot air or flowing solder, or the lack of sufficient solder thickness intrinsic to roller tinning. The present methods may be utilized with various solders, including lead-free solders such as tin-silver-copper compositions.

Figure 1:
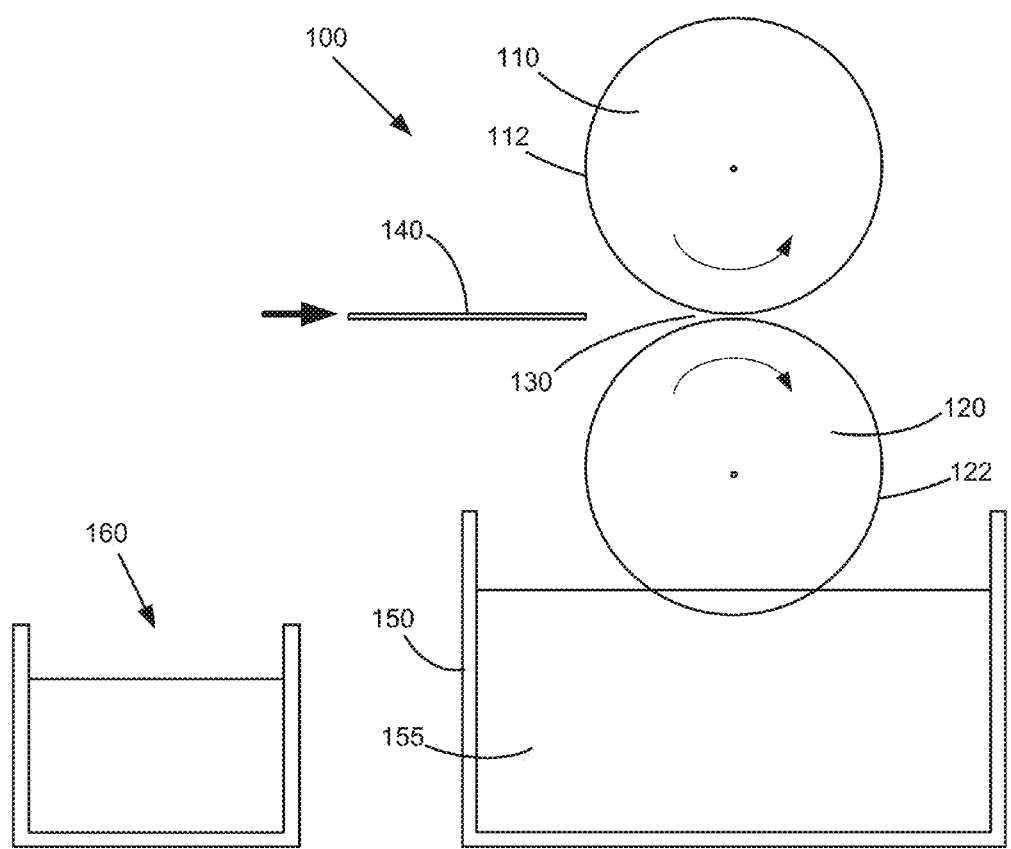
FIG. 1 shows a side view of an exemplary solder application apparatus.

FIG. 1 depicts a side view of an exemplary solder application system 100. The system 100 includes a first roller 110 adjacent to a second roller 120, which forms a nip area 130 between the rollers 110 and 120 through which a component 140 is to be fed. In this embodiment, the first roller 110 and second roller 120 are aligned vertically with respect to each other such that a metallic article or other component 140 is fed substantially horizontally between the first and second rollers 110 and 120, although a vertical or angled alignment are also possible. First and second rollers 110 and 120 are shown as having approximately the same diameter in this embodiment, although in other embodiments they may have diameters that are different from each other. The component 140 is prepared by pre-dipping a free-standing, uncoated component in molten solder, such that a bulk amount of solder coats the component 140 prior to entering the rollers 110 and 120. In the embodiment of FIG. 1, the second roller 120 is located between the first roller 110 and a solder tank 150, where the solder tank 150 is adapted to hold molten solder 155. The second roller 120 is positioned at least partially in the solder tank 150, so that the roller 120 contacts the molten solder 155 in tank 150. As the second roller 120 rotates, solder tank 150 can serve to collect solder removed from the component 140, to clean the second roller 120 during rotating of the second roller, and to provide heated solder to the nip area 130 so that solder on component 140 becomes molten when entering rollers 110 and 120. In some embodiments, an additional solder tank 160 may be provided, for preparing the component 140 by pre-dipping an uncoated workpiece into solder prior to feeding the component 140 into rollers 110 and 120.

First roller 110 has a first outer surface 112, while second roller 120 has a second outer surface 122. At least one of the outer surfaces 112 or 122 comprises a solder wicking material. As the component 140 is fed into nip area 130, the component 140 contacts the wicking material. The wicking material provides a wetting surface that will wick away excess solder from the component, blotting away solder and reducing the solder thickness to a desired level. Thus, solder is removed using the wicking properties of the roller, rather than using imposed forces such as hot air that may damage the component 140 or may not provide fine enough control of the amount of solder to be removed. The component 140 may be fed into the rollers manually or automatically. For example, the component 140 may be manually fed into the system 100 by an operator's hand that holds the component 140 on one end until it is fed through the rollers 110 and 120 by the forces exerted onto it by nip 130. In other embodiments, the component 140 may be inserted automatically using a conveyor belt (not shown) on which the component 140 sits, or two conveyor belts which move in unison, with one rotating clockwise and another laying above it and moving counter clockwise, in contact with the first belt such that component 140 is held between both belts. In another example of an automatic process, component 140 may be fed into the roller s 110 and 120 using a robotic arm with an end effector that holds component 140 from one edge, such that the other edges are available to be presented to the nip 130.

Figure 2:
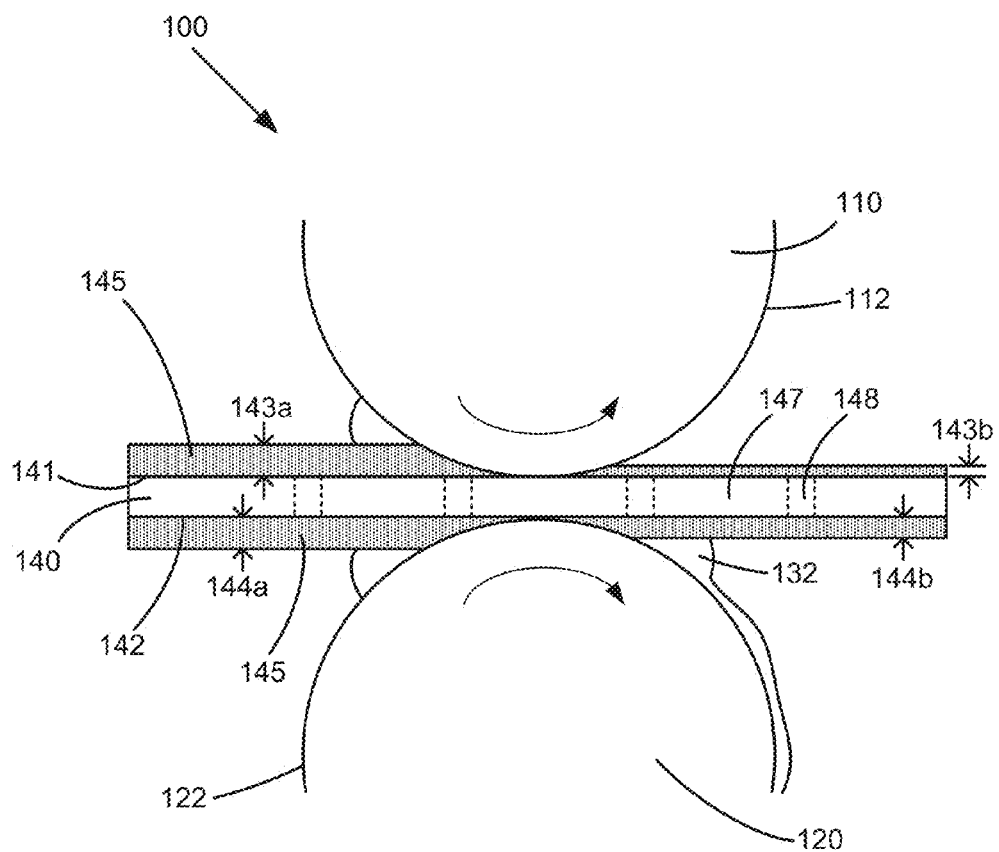
FIG. 2 provides a detailed view of an embodiment of a solder application process, using the apparatus of FIG. 1.

FIG. 2 shows a detailed view of the component 140 with solder being blotted or removed by the wicking action of the roller system 100. Component 140 is a metallic article that has been pre-dipped or coated in solder 145, such that component 140 has a solder thickness 143*a* on a first side 141 of component 140, and a solder thickness 144*a* on a second, opposite side 142 of component 140 prior to being fed into the roller apparatus 100. As shown in FIG. 2, component 140 may be a metallic article having openings through its thickness, from its first side 141 to its second side 142, such as having a plurality of intersecting grid lines 148 with spaces 147 between the grid lines 148. For example, the spaces 147 of metallic article 140 may represent an open area of at least 50%, such as 50%-99% of the metallic article 140.

In the embodiment of FIG. 2, first roller 110 has an outer surface 112 comprising a non-solder-wicking material, while second roller 120 has an outer surface 122 comprising a solder wicking material. In this disclosure, the term "non-solder-wicking" and "non-wicking" shall be used interchangeably. Non-wicking materials may be, for example, fluoropolymers (e.g., Teflon®), silicones, stainless steel, and titanium; while wicking materials may include, for example, standard steel, copper or tin. Solder wicking materials having a low contact angle with molten solder, for example materials with a contact angle less than 10 degrees. Non-solder-wicking materials may have, for example, contact angles to molten solder of greater than 60 degrees. Rollers 110 and 120 are heated, causing solder 145 on component 140 to melt as it enters the nip area 130. As the component 140 passes through rollers 110 and 120, the non-wicking roller 110 pushes or squeezes the solder 145 to the other side of the component 140, such as through openings 147 in component 140, while the wicking roller 120 draws solder toward it. Thus, the initial solder thickness 143*a* on first side 141 is reduced to a final solder thickness 143*b* as the component 140 exits the rollers 110 and 120. Similarly, initial solder thickness 144*a* on the opposite surface 142 of component 140 is reduced to a solder thickness 144*b* after exiting roller apparatus 100. A bead of solder 132 in the exit region of the rollers 110 and 120 shows the wetting or wicking action of roller 120 as the component 140 leaves the nip 130.

The blotting process can use one roller with a solder wicking surface and one roller having a non-wicking surface to molten solder, as described in the embodiment of FIG. 2, to provide different amounts of solder on different surfaces of the component. That is, after exiting the first and second rollers 110 and 120, the metallic article of component 140 has a first solder thickness 143*b* on the first side 141 that is different from a second solder thickness 144*b* on the second side 142. For example, if the component 140, comprising a metallic article pre-dipped in molten solder, is passed through the solder application system 100 with one non-wicking roller 110 and one wicking roller 120, the side of the component 140 in contact with the wicking roller 120 will exit with a greater thickness of solder on it. This is because the non-wicking roller 110 will squeeze any excess solder away from it and towards the wicking roller 120. As the component 140 exits the nip 130 between the rollers 110 and 120, excess solder is divided between the wicking roller 120 and the side of the component 140 facing the wicking roller 120, thus resulting in more solder (thickness 144*b*) on that side of the component 140. This result is unexpected, as it would be thought that the non-wicking side of the component would actually result in a thicker layer of solder, due to the solder on the non-wicking side not being wicked away onto that roller (e.g., roller 110). In the vertical arrangement of rollers as in FIGS. 1-2, gravity may also contribute in solder removal when the wicking roller is the lower roller 120 and large volumes of solder are to be removed such that their weights overcome the capillary forces exerted upon them. In some embodiments the first side 141 of the metallic article or component 140 faces the first roller 110, and a second solder thickness 144*b* on the second side 142 of the metallic article is greater than a first solder thickness 143*b* on the first side 141 of the metallic article after exiting the first (non-wicking) roller 110 and second (wicking) roller 120. The wicking material causes a thicker solder coating to be formed on a side of the metallic article facing the second roller 120 than on an opposite side of the metallic article facing the first roller 110 with the non-wicking material. In other embodiments, no solder or a negligible amount may remain on the non-wicking side (e.g., solder thickness 143*b*) after the blotting process.

In yet other embodiments, both the first roller and the second roller can have outer surfaces comprising wicking materials. This may result in the solder thicknesses on both sides of the component 140 to be similar to each other after exiting the rollers 110 and 120, while still providing removal of solder from the component 140 to achieve a desired final thickness. The wicking materials on the first and second rollers 110 and 120 may be the same from each other, or different. The final solder thickness is controlled by factors such as the speed, temperature, and wetting properties of the rollers 110 and 120. In yet further embodiments, the arrangement of wicking and non-wicking rollers may be reversed from what has been described for FIG. 2. That is, wicking material may be on the upper roller 110, and a non-wicking material may be on the lower roller 120. The blotting process can make use of one or two wicking surfaces to remove excess solder from the part.

Returning to FIG. 2, in certain embodiments the outer surface 112 comprising the non-wicking material is elastic. Elastic non-wicking materials may be, for example, fluoropolymers and silicones, while rigid non-wicking materials include, for example, stainless steel and titanium. The outer surface 112 comprising the elastic material conforms to the metallic article of component 140 when the component 140 is fed through the first and second rollers 110 and 120, to further assist in displacing the solder to the opposite side of the part that is being processed. In some embodiments, the first roller 110 may be provided to be in contact with the second roller 120. The elastic roller 110 can help in ensuring intimate contact of the metallic article of component 140 to the second roller 120 by conforming to any defects that may distort the ideal shape of either roller 110 or 120, or that may distort the shape of the metallic article to be coated. The elastic roller 110 also prevents any excess forces from being applied to the metallic article of component 140, which could potentially permanently deform the component 140.

In some embodiments, the rollers may be heated to temperatures between, for example 200-280° C., such as approximately 240° C., to correspond to typical solders with melting temperatures of 200-280° C. Other temperatures may be used, as required for a specific solder type. Fluxes may be used for both the pre-dipping and the roller blotting portions of the process. For example, a flux such as an ammonium chloride/zinc chloride flux can be used for the dipping step, whereas for the blotting step, no flux is used. In other embodiments, a flux is used during dipping, and a mild flux such as a halide-free, low-solids, no-clean flux is used for the roller blotting. Roller widths may be chosen according to the width of the part being processed, with a small margin for handling and positioning tolerance. For example, for a 150 mm wide component, a 155 mm roller width may be used. Roller diameters may range from, for example, 25-200 mm in diameter. Both rollers may be the same diameter, or may be different from each other. For example, in one embodiment the wicking roller may be 100 mm diameter and the non-wicking diameter may be 25 mm diameter. The choice of roller diameter may be made such that the adhesion of the component 140 may be preferentially directed towards one roller or another to thus facilitate moving the part upwards or downwards out of the nip. For example, a smaller diameter roller reduces adhesion to that roller. However, a larger diameter roller increases the heat capacity to keep the solder molten during processing. Thus, the diameters of rollers 110 and 120 may be optimized to achieve sufficient heating while facilitating removal of the component 140 from the system 100.

A desired solder thickness on the component is achieved by adjusting process parameters. In one aspect, setting a speed of feeding the metallic article between the first and second rollers contributes to controlling the solder thickness on the metallic article. For example, roller speed may range from 0.5 m/min to 15 m/min, such as from 5-10 m/min. Roller pressure can also affect solder thickness. In a vertical arrangement of rollers, such as in FIG. 1, pressure for the upper roller may be, for example, from 0-10 lbs/linear inch (e.g., 120 lbs pressure on a 12" long roller), such as between 0-5 lbs/inch, such as approximately 1 lb/inch. The gap and pressure between the first and second rollers may also affect the final solder thickness, such as using zero gap with the rollers in contact with each other, or using a non-zero gap. When using a zero gap between rollers, the final solder thickness is determined by the dynamics of a fluid bearing formed by the molten solder between the rollers and the metallic article, which can exert significant pressure against the rollers as it enters the nips and separates them. For example, for non-zero gaps between rollers the coatings of solder may be in the 1-3 µm range. For thicker coatings a non-zero gap may be used, which allows for a larger thickness of solder to remain on the article. In such embodiments thicknesses can be controlled to values of up to 30 µm by the gap between the rollers. If the rollers are separated by too great an amount, the solder may never interact with the rollers or may have such small pressure forces exerted on it by the rollers that the final thickness of solder is determined primarily by natural fluid dynamics of the solder and metallic article system alone.

Additional factors that can contribute to controlling the final solder thickness on component 140 include adjusting the temperature of the solder and/or the rollers, use of surfactants, and texturing the roller. Temperature will affect the viscosity of the solder, such that, for instance, higher temperatures will cause the solder to flow more readily and result in a thinner coating. In another aspect, flux or other substances may be used as a surfactant to change the surface energy of the metallic article and solder. Texturing of the outer surface of the roller can affect how much solder is held by the surfaces of the rollers.

Parts that are solder-coated using the present dipping and blotting methods have significantly more uniform and controlled amounts of solder over fine features than those coated using simple dipping, wave solder, or solder fountain approaches. Also, significantly more solder can be achieved on parts than those coated using, for example, roller tinning Furthermore, components are uniformly coated on all each side of the part. As such, parts coated using the present dipping and blotting methods will be better protected from the environment because the molten solder process forms a more dense layer on the component than, for example, electroplating. The dipping and blotting process eliminates the need for hot air knives and eliminates the need for any significant amount of flowing solder, which can damage fragile components and also exposes a large amount of solder to the environment, creating significant amounts of dross (oxidized solder). The dipping and blotting process of the present disclosure can be used to produce a consistent solder coating on thin, flexible components either in a roll-to-roll configuration, or on a single item at a time, because the dipping process does not apply any significant amount of forces to the component; and the blotting process, particularly if done with rollers, can easily handle thin, flexible, and flat components.

Figure 3:
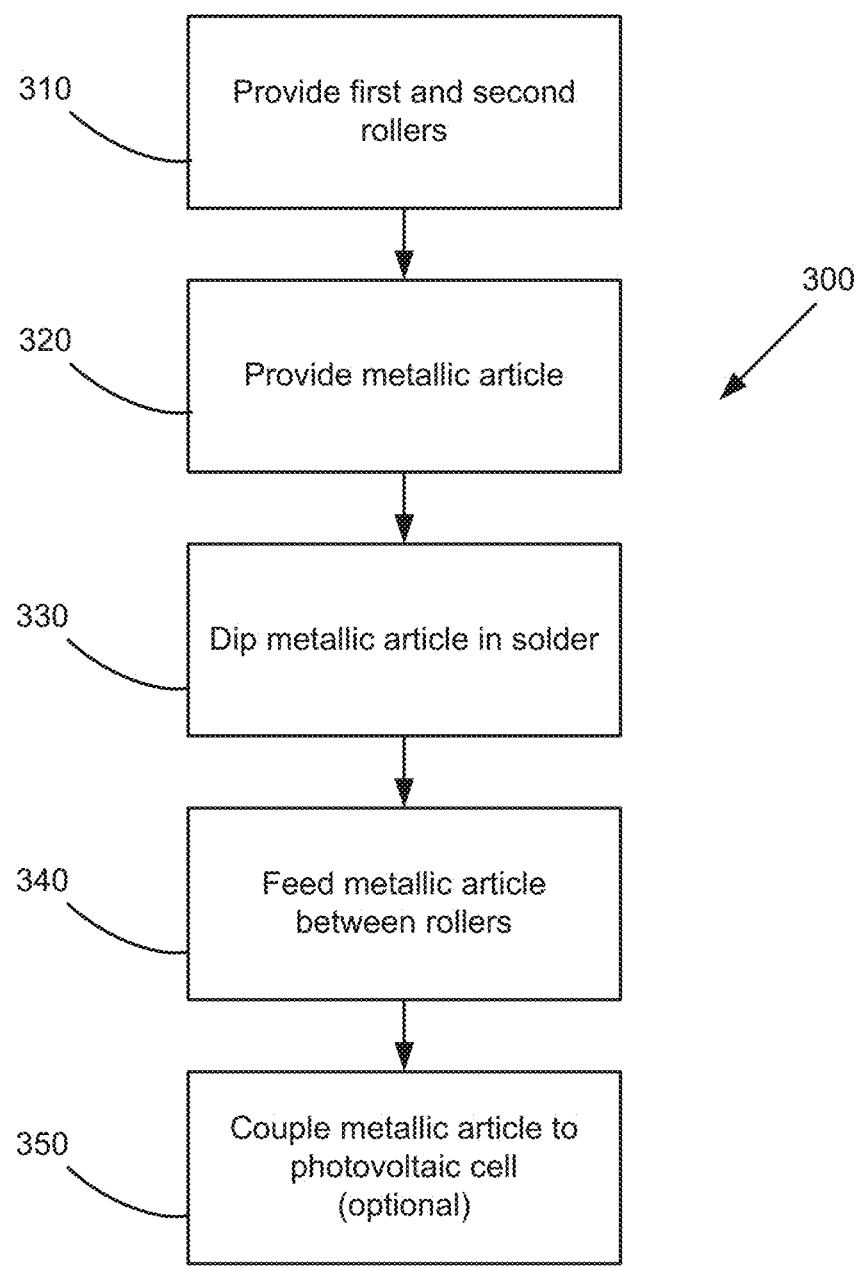
FIG. 3 is a flowchart of an exemplary solder application method.

In an exemplary solder application method 300 shown in the flowchart of FIG. 3, first and second rollers are provided in step 310. At least one of the first and second rollers has an outer surface comprising a wicking material. Step 310 may include positioning the second roller at least partially in a solder tank, the second roller being located between the first roller and the solder tank, where the solder tank is adapted to hold solder. Step 310 may also include providing a plurality of wires on the outer surface comprising the wicking material, where the plurality of wires support the metallic article as the metallic article exits the first and second rollers. In step 320, a metallic article is provided. The metallic article may be a component that is fragile or flexible such that the desired level of solder thickness control is difficult to achieve using conventional solder application methods. The metallic article has an opening extending from a first side to a second side of the metallic article, such that solder may traverse through the opening from one surface of the metallic article to an opposite surface. In some embodiments, the metallic article is a free-standing piece and has a grid-like structure with openings, such as being configured with intersecting grid lines. In step 330, the process includes dipping the metallic article into a bath of molten solder. The bath may be, for example, solder tank 150 or 160 of FIG. 1. The dipping forms an initial coating of solder on the metallic article.

After dipping the metallic article in solder in step 330, the metallic article is fed between the first and second rollers in step 340. The wicking material removes solder from the metallic article, such that a solder thickness of the initial coating on the metallic article is reduced after exiting the first and second rollers. After exiting the rollers, the thickness on the first side of the metallic article may be different from, or the same as, the thickness on the second side of the metallic article. In some embodiments, while feeding the metallic article between the first and second rollers, the first side of the metallic article faces the first roller, and the first and second rollers displace solder from the first side to the second side through the opening in the metallic article. In step 340, the first and second rollers are heated. Solder thickness on the finished metallic article may be controlled by process parameters, such as by setting a speed of feeding the metallic article between the first and second rollers. Step 340 may include rotating the second roller during the feeding of the metallic article between the first and second rollers, where the second roller is cleaned by solder in the solder tank during the rotating. In an optional step 350, the metallic article is coupled to the surface of the photovoltaic cell, where the surface may be a light-incident surface of the photovoltaic cell. In step 350 the metallic article is soldered to the photovoltaic cell to provide mechanical and electrical coupling. The metallic article may then serve as an electrical conduit for the photovoltaic cell.

Figure 4A:
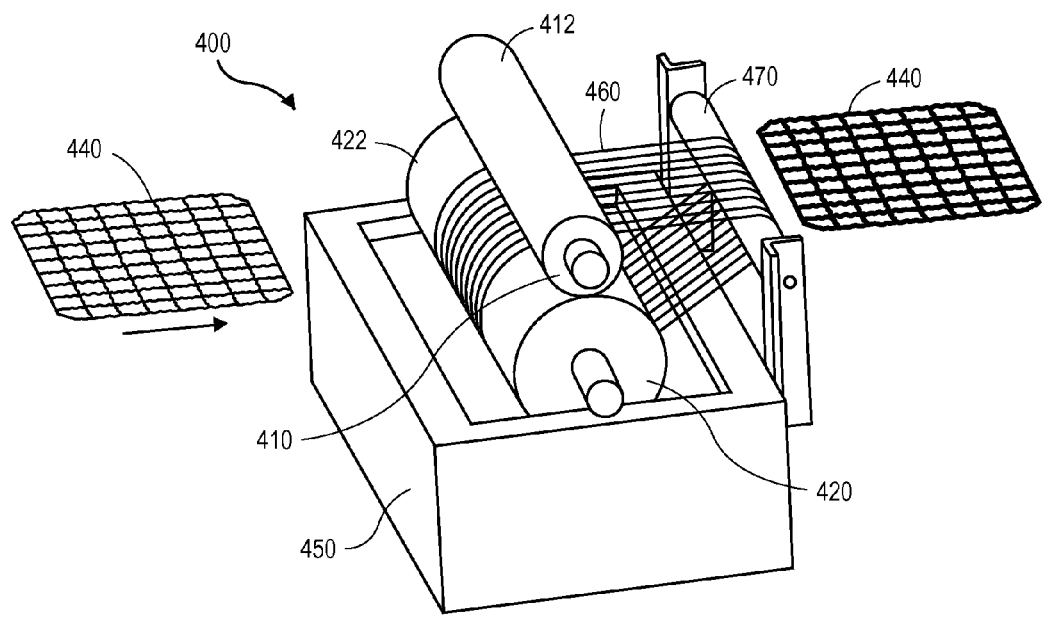
FIGS. 4A-4B show another embodiment of a solder application apparatus.
Figure 4B:
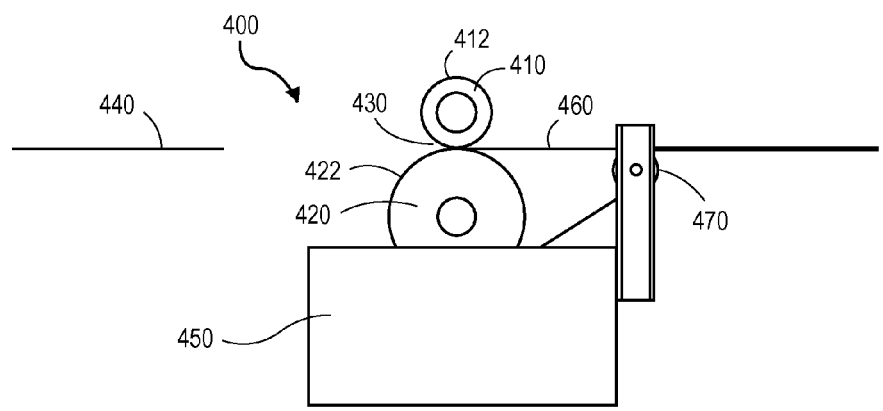

FIGS. 4A-4B are perspective and side views, respectively, of another embodiment of a solder application system 400 in which a set of wires is used to assist in transporting the component being processed. System 400 includes a first roller 410, a second roller 420, and a solder tank 450. In this embodiment, the diameter of first roller 410 is smaller than second roller 420. First roller 410 has an outer surface 412 comprising a non-wicking material. Second roller 420 has an outer surface 422 of a solder wicking material, and plurality of wires 460 is provided on the outer surface 422 comprising the wicking material. The wires 460 are wrapped around a portion of the circumference of roller 420, and in a closed loop around a support roller 470 that is spaced apart from roller 420 such that the wires extend between second roller 420 and support roller 470. The plurality of wires 460 support the metallic article 440 as it exits the first and second rollers 410 and 420, to help separate the metallic article 440 from the wicking roller 420 as it exits system 400. In the embodiment of FIG. 4A, the wires 460 form a plane on which the metallic article 440 is transported, to prevent the metallic article 440 from wrapping onto roller 420 as it exits the solder application system 400. The wires 460 are spaced apart from each other so as not to interfere with the solder on the metallic article 440. The wires 460 may be non-wicking such that the solder coated metallic article can be easily removed from them. The wires 460 should also be insoluble in the molten solder to ensure a long lifetime. Materials for the wires 460 include, for example, titanium, molybdenum, and stainless steel.

The solder application process as described herein, with solder removal capabilities using a wetting material, is particularly suitable to fragile and/or flexible components. In some embodiments, the component is a metallic article comprising a grid of intersecting lines, as disclosed in Babayan et al., U.S. patent application Ser. No. 13/798,123, entitled "Free-Standing Metallic Article for Semiconductors" and filed on Mar. 13, 2013; and Babayan et al., U.S. Pat. No. 8,569,096, entitled "Free-Standing Metallic Article for Semiconductors" and issued on Oct. 29, 2013, both of which are owned by the assignee of the present disclosure and are hereby incorporated by reference. Other metallic articles that may be used with the present solder application process are disclosed in Babayan et al., U.S. patent application Ser. No. 14/079,540, entitled "Adaptable Free-Standing Metallic Article For Semiconductors" and filed on Nov. 13, 2013; U.S. patent application Ser. No. 14/139,705, entitled "Free-Standing Metallic Article With Overplating" and filed on Dec. 23, 2013; and U.S. patent application Ser. No. 14/079,544, entitled "Free-Standing Metallic Article With Expansion Segment" and filed on Nov. 13, 2013; all of which are owned by the assignee of the present disclosure and are hereby incorporated by reference.

Figure 5:
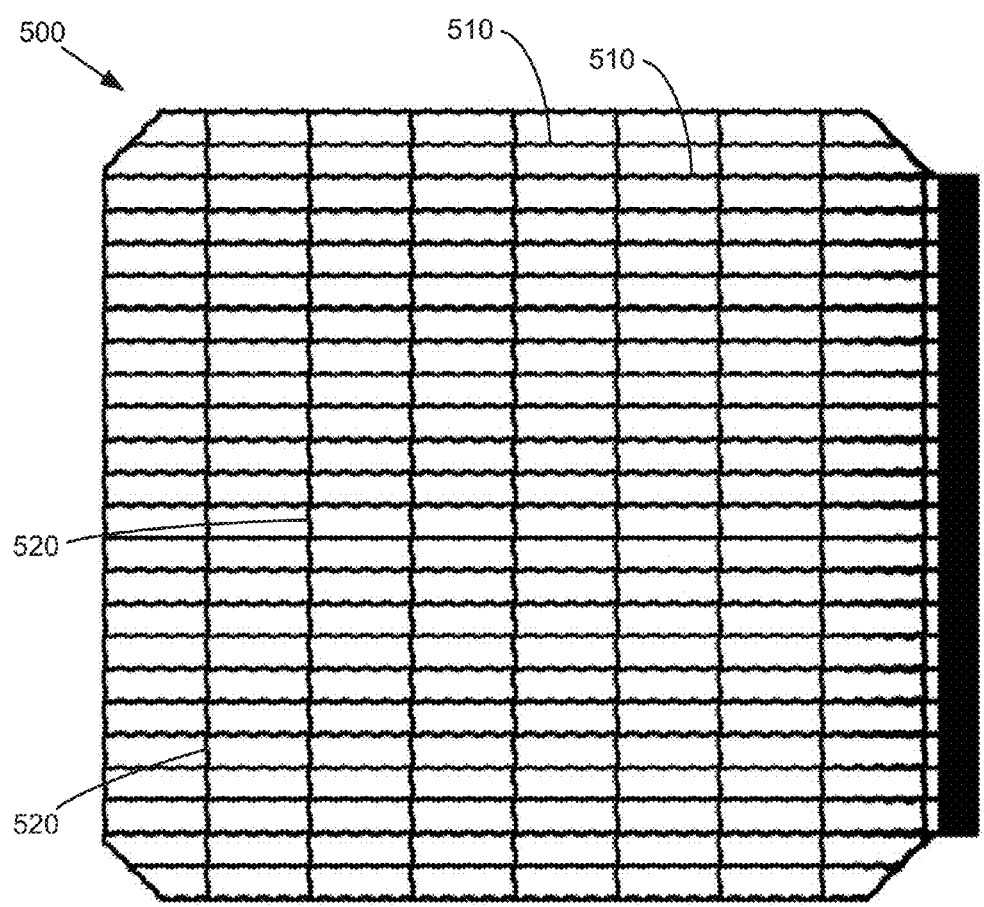
FIG. 5 is a top view of an exemplary metallic which may be used with the present methods.

FIG. 5 shows an exemplary metallic article 500 of U.S. patent application Ser. No. 14/079,540, which is free-standing and comprises a plurality of intersecting grid lines 510 and 520 that form openings between the grid lines. When having solder applied using the present methods, metallic article 500 is first appropriately cleaned and fluxed, then dipped into a bath of molten solder to fully cover all surfaces of the component with solder. The article 500 is then passed through a roller blotting tool as described herein, to achieve a desired solder thickness on one or both sides of the metallic article 500. The metallic article 500 can then serve as an electrical conduit for a surface of a photovoltaic cell, the electrical conduit being a free-standing piece to be coupled to the photovoltaic cell.

Variations of the methods and systems described herein are possible. For example, the rollers may be stacked side by side rather than vertically, so that the component is fed vertically through the rollers. In another example, a series of roller sets may be utilized rather than one pair as shown in the present disclosure.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method of applying solder, the method comprising:
    providing a first roller and a second roller, wherein at least one of the first and second rollers has an outer surface comprising a solder wicking material;
    providing a metallic article having a first side and a second side, the metallic article having an opening extending from the first side to the second side;
    dipping the metallic article in molten solder, wherein the dipping forms an initial coating of solder on the metallic article;
    after the dipping, feeding the metallic article between the first and second rollers; and
    providing a plurality of wires on the outer surface comprising the solder wicking material, wherein the plurality of wires support the metallic article as the metallic article exits the first and second rollers;
    wherein the wicking material removes solder from the metallic article, such that a solder thickness of the initial coating on the metallic article is reduced after exiting the first and second rollers.

2. The method of claim 1 further comprising:
    positioning the second roller at least partially in a solder tank, the second roller being located between the first roller and the solder tank, wherein the solder tank is adapted to hold solder; and rotating the second roller during the feeding of the metallic article between the first and second rollers, wherein the second roller is cleaned by solder in the solder tank during the rotating.

3. The method of claim 1 wherein after exiting the first and second rollers, the metallic article has a first solder thickness on the first side that is different from a second solder thickness on the second side.

4. The method of claim 1 wherein both the first roller and the second roller have outer surfaces comprising solder wicking materials, the first roller being positioned above the second roller, wherein the plurality of wires are on the outer surface of the second roller.

5. The method of claim 1 wherein the first roller has a first outer surface comprising a non-wicking material, and the second roller has a second outer surface comprising the solder wicking material.

6. The method of claim 5 wherein the first outer surface comprising the non-wicking material is elastic.

7. The method of claim 6 wherein the first outer surface comprising the elastic material conforms to the metallic article when the metallic article is fed through the first and second rollers.

8. The method of claim 5 wherein, while feeding the metallic article between the first and second rollers, the first side of the metallic article faces the first roller, and the first and second rollers displace solder from the first side to the second side through the opening in the metallic article.

9. The method of claim 5 wherein the first side of the metallic article faces the first roller, and wherein a second solder thickness on the second side of the metallic article is greater than a first solder thickness on the first side of the metallic article after exiting the first and second rollers.

10. The method of claim 5 wherein the wicking material causes a thicker solder coating to be formed on a side of the metallic article facing the second roller than on an opposite side of the metallic article facing the first roller with the non-wicking material.

11. The method of claim 5 wherein the non-wicking material comprises a material chosen from the group consisting of fluoropolymers, silicones, stainless steel, and titanium.

12. The method of claim 1 wherein the solder wicking material comprises a material chosen from the group consisting of standard steel, copper and tin.

13. The method of claim 1 further comprising controlling the solder thickness on the metallic article by setting a speed of feeding the metallic article between the first and second rollers.

14. The method of claim 1 wherein the first and second rollers are heated.

15. The method of claim 1 wherein the first and second rollers are aligned vertically with respect to each other such that the metallic article is fed horizontally between the first and second rollers.

16. The method of claim 1 wherein the metallic article comprises an open area of at least 50%.

17. The method of claim 1 wherein the metallic article comprises a plurality of intersecting grid lines, and wherein the metallic article is an electrical conduit for a surface of a photovoltaic cell, the electrical conduit being a free-standing piece to be coupled to the photovoltaic cell.

18. The method of claim 17 further comprising coupling the metallic article to the surface of the photovoltaic cell.

19. The method of claim 18 wherein the surface is a light-incident surface of the photovoltaic cell.

* * * * *